United States Patent
Tsai et al.

(10) Patent No.: US 6,875,705 B2
(45) Date of Patent: Apr. 5, 2005

(54) METHOD OF HIGH SELECTIVITY WET ETCHING OF SALICIDES

(75) Inventors: Chao-Jie Tsai, Hsin-Chu (TW); Jeng Yang Pan, Taipei (TW); Chin-Nan Wu, Ilan (TW); Meng-Chang Liu, Chia-Yi (TW); Su-Yu Yeh, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 245 days.

(21) Appl. No.: 10/235,193

(22) Filed: Sep. 4, 2002

(65) Prior Publication Data

US 2004/0043624 A1 Mar. 4, 2004

(51) Int. Cl.$^7$ .............................................. H01L 21/302
(52) U.S. Cl. ...................... 438/745; 438/630; 438/683; 438/750
(58) Field of Search ................................ 438/745, 750, 438/754, 682, 683, 686, 630, 649

(56) References Cited

U.S. PATENT DOCUMENTS

| | | | | | |
|---|---|---|---|---|---|
| 5,933,757 | A | * | 8/1999 | Yoshikawa et al. | 438/682 |
| 6,271,133 | B1 | * | 8/2001 | Lim et al. | 438/683 |

* cited by examiner

Primary Examiner—Lan Vinh
(74) Attorney, Agent, or Firm—Tung & Associates

(57) ABSTRACT

A method for forming salicides with lower sheet resistance and increased sheet resistance uniformity over a semiconductor process wafer including providing a semiconductor process wafer having exposed silicon containing areas at a process surface; depositing a metal layer including at least one of cobalt and titanium over the process surface; carrying out at least one thermal annealing process to react the metal layer and silicon to form a metal silicide over the silicon containing areas; and, wet etching unsilicided areas of the metal layer with a wet etching solution including phosphoric acid ($H_3PO_4$), nitric acid ($HNO_3$), and a carboxylic acid to leave salicides covering silicon containing areas at the process surface.

20 Claims, 2 Drawing Sheets

METHOD OF HIGH SELECTIVITY WET ETCHING OF SALICIDES

FIELD OF THE INVENTION

This invention generally relates to semiconductor processing methods for forming salicides (self-aligned silicides) over silicon or polysilicon areas of a deep-submicron CMOS semiconductor device and more particularly to a selective wet etching method to remove residual metal and metal nitrides during salicide formation.

BACKGROUND OF THE INVENTION

In the integrated circuit industry today, hundreds of thousands of semiconductor devices are built on a single chip. Contact resistances between functioning areas of a CMOD device, such as a source or drain region, is critical to the functioning of a CMOS device, for example a transistor. For example, metal interconnect features are formed to connect source and drain regions to other parts of a functioning semiconductor device. Source and drain regions of a transistor are doped portions of a semiconductor substrate, for example single crystal silicon. The source and drain regions are typically formed by implanting ions in the silicon substrate to achieve n-doped regions or p-doped regions. To prevent the contamination of the silicon substrate by contacting metal interconnects, an intermediate layer of a metal silicide is formed over the silicon substrate, for example, titanium silicide or cobalt silicide. Metal silicides are thermally stable at higher temperatures and prevent metals from diffusing into the silicon substrate which will alter electrical properties.

One requirement of the metal silicide is the necessity for low sheet resistance or contact resistance to the silicon substrate. In this regard, cobalt silicide (e.g., CoSi2) and titanium silicide (TiSi2) have the lowest resistivity and therefore provide a lower contact resistance to the silicon semiconductor substrate. The severity of the effect of increased resistance on the drain side of the transistor depends on whether the transistor is operating in the saturated region or the linear region, where the reduction of drain voltage has less effect if operation is in the saturated region. Increased contact resistance on the source side of the transistor is generally more severe, reducing the effective gate voltage and severely degrading device performance. It has been found that self aligned silicides (salicides) covering the entire source/drain area is the one of the most effective solutions to decreasing contact resistance and improving device performance allowing device scaling below 0.25 microns.

One problem in forming salicides having line widths less than about 0.5 microns, is the tendency of titanium silicides to agglomerate when formed overlying gate, source, and drain regions and subjected to high annealing temperatures, typically using a rapid thermal anneal (RTA), also referred to as a rapid thermal process (RTP). For example, in the formation of titanium silicide, typically a two-step process is required to form the low electrical resistance phase of titanium silicide, frequently requiring annealing temperatures of up to 800° C. In smaller line width areas, the titanium silicide has difficulty achieving the nucleation and growth of the crystalline phase required for low electrical resistance, requiring higher annealing temperatures, which frequently causes agglomeration of the silicide. Consequently, cobalt silicide is a preferred material for forming salicides for sub-quarter micron devices since the required phase transformation to form the low electrical resistance crystalline phase takes place at lower temperatures, for example, from about 600° C. to about 700° C. without the problem of silicide agglomeration.

In a typical salicide process, a metal, for example titanium or cobalt is deposited to cover the gate, source and drain regions. The metal is then subjected to a two step high temperature anneal where a metal silicide is formed by the diffusion of silicon from underlying areas including silicon or polysilicon into the overlying metal area thereby forming metal silicides. Carrying out the annealing process in nitrogen causes formation of metal nitrides within the metal, for example titanium nitride, slowing the silicon diffusion to prevent what is referred to as bridging, where silicon diffuses into the sidewall regions of the deposited metal along the gate causing a short electrical circuit between the gate region and the source/drain region. The likelihood of bridging increases as the annealing temperature is increased, providing another factor favoring the use of cobalt silicide at least for the formation of salicides over the gate and source/drain regions.

Following formation of the silicided areas over the gate and source/drain regions, a wet etching process is carried out to etch away remaining metal of metal nitrides from unsilicided areas, to form self aligned silicides (salicides) over the respective gate and source/drain regions. One problem with the prior art wet etching process for forming salicides is the poor selectivity demonstrated by prior art etching solutions including, for example, standard cleaning 1 (SC-1) and SC-2, which are typically used as sequential cleaning solutions including mixtures of NH4OH—H2O2—H2O, and HCL—H2O2—H2O, respectively. Poor selectivity of the wet etching solution of the metal and metal nitride portions with respect to the silicided portions will result in, on the one hand, underetching, where residual metals or metal nitrides remain on the sidewall spacers of the gate structure, and on the other hand, overetching of the silicided portions over the gate and source/drain regions. As a result, non-selective etching causes non-uniformities over the wafer resulting in out of specification electrical resistances including sheet resistances over a large percentage of the silicided wafer areas. In addition, poor etching selectivity can detrimentally affect gate oxide integrity. The problem of poor selectivity is especially a concern with cobalt silicide formed over narrow line width areas where silicide defects caused by overetching have a significant effect on electrical behavior, for example, forming nanometer sized voids, leading to increased junction leakage.

There is therefore a need in the semiconductor processing art to develop a method for a reliable and uniform selective wet etching process to form low sheet resistance salicides over sub-quarter micron semiconductor devices with reliable and uniform electrical behavior.

It is therefore an object of the invention to provide a method for a reliable and uniform selective wet etching to form to form low resistance salicides over sub-quarter micron semiconductor devices thereby improving electrical behavior including sheet resistances while overcoming other shortcomings of the prior art.

SUMMARY OF THE INVENTION

To achieve the foregoing and other objects, and in accordance with the purposes of the present invention, as embodied and broadly described herein, the present invention provides a method for forming salicides with lower sheet resistance and increased sheet resistance uniformity over a semiconductor process wafer.

In a first embodiment, the method includes providing a semiconductor process wafer having exposed silicon containing areas at a process surface; depositing a metal layer including at least one of cobalt and titanium over the process surface; carrying out at least one thermal annealing process to react the metal layer and silicon to form a metal silicide over the silicon containing areas; and, wet etching unsilicided areas of the metal layer with a wet etching solution including phosphoric acid ($H_3PO_4$), nitric acid ($HNO_3$), and a carboxylic acid to leave salicides covering silicon containing areas at the process surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps included in forming salicides in a sub-quarter micron technology CMOS transistor. It will be appreciated that the method may be used with larger device technologies, but that it is most advantageously used with sub-quarter micron technologies, or where the salicide linewidth is less than about 0.5 microns. It will be appreciated that although direct benefits will be realized according to the method of the present invention by avoiding non-selective etching of silicided portions of the gate and source/drain regions in forming salicides, that other indirect benefits will additionally be realized including the improved electrical performance and reliability of the semiconductor device such as increased gate oxide integrity, more uniform sheet resistance, and reduced junction leakage. It will further be appreciated that although the method of the present invention is advantageously used, and an exemplary implementation detailed with respect to, the formation of and etching of cobalt silicide to form salicides, that the wet etching process of the present invention may be advantageously used for the selective etching of other metal silicides including, for example, titanium silicide.

Figure 1A:
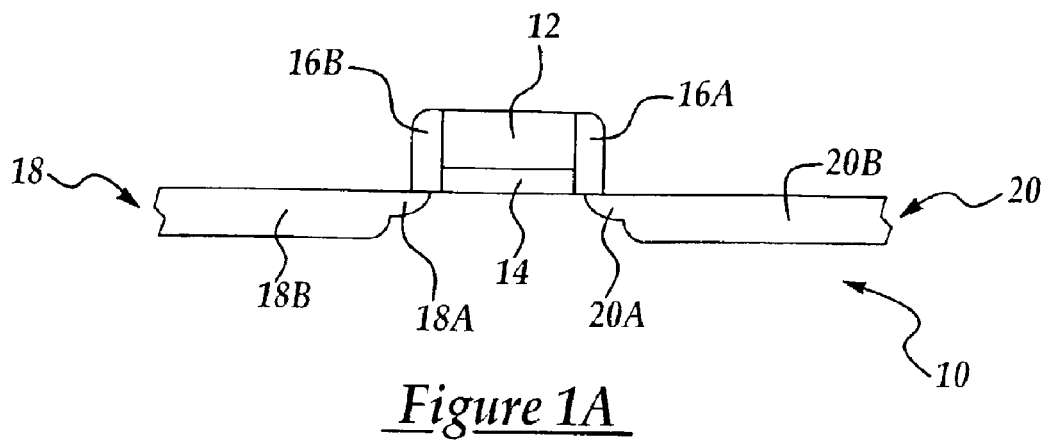
FIGS. 1A–1C are cross sectional side views of a portion of a CMOS transistor showing manufacturing stages for forming salcides according to an embodiment of the present invention.
Figure 1B:
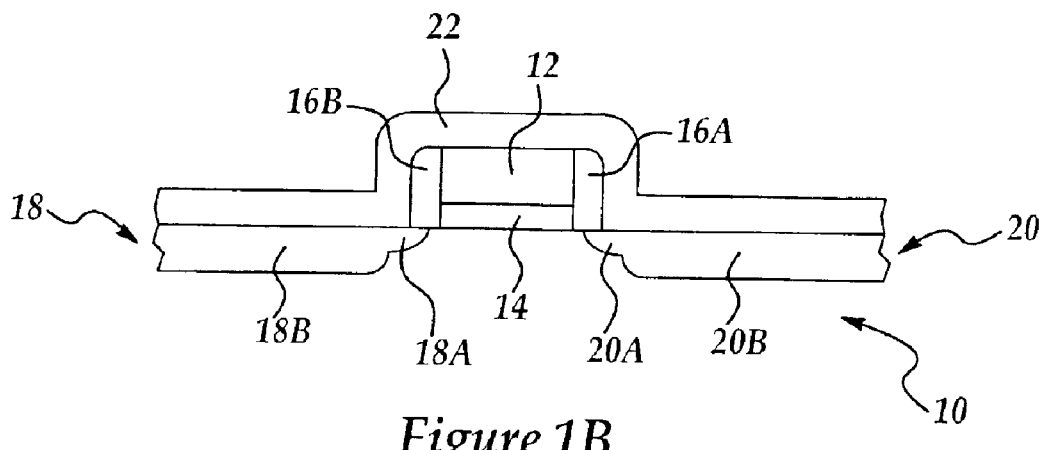
Figure 1C:
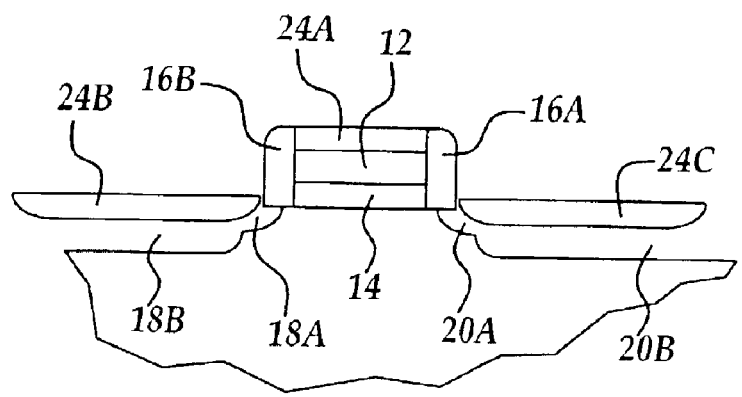

In an exemplary embodiment of the present invention, reference is made to FIGS. 1A–1C where cross sectional side views of portions of a semiconductor device are shown at stages in the manufacturing of salicides over gate and source/drain regions of the semiconductor device. For example, referring to FIG. 1A, is shown a portion of a CMOS transistor structure having a polysilicon gate 12 formed over a gate oxide 14, and having sidewall oxide spacers 16A and 16B formed according to known processes in the art. For example, doped regions in the silicon substrate 10, include a doped source region, e.g., 18 and a doped drain region, e.g., 20, including lightly doped regions (LDD) 18A, 20A, which are formed by conventional ion implantation techniques following patterning of polysilicon gate 12. subsequently, sidewall spacers 16A and 16B, formed of a silicon oxide or other dielectric, are patterned and formed along the sidewalls of the polysilicon gate. Another ion implantation is carried out using the sidewall spacers 16A and 16B as an implantation mask to form more heavily doped regions, e.g., 18B, 20B, adjacent to the LDD regions, e.g., 18A, 20A. Electrical interconnects are later created over the gate and source/drain regions to provide electrical communication between the transistor and other device areas where proper electrical functioning is critically dependent on the formation of low contact resistance to the gate and source/drain regions including ohmic-like behavior.

Referring to FIG. 1B, a metal layer 22, preferably cobalt, is blanket deposited by a conventional PVD method to a thickness of about 20 nanometers to about 100 nanometers. It will be appreciated that titanium metal may be used to form a titanium silicide, however, cobalt is preferred for forming self-aligned silicides (salicides) having linewidths of less than about 0.5 microns due to the more reliable phase transformation to form low sheet resistance salicides at lower temperatures compared to titanium silicide. For example, following deposition of the cobalt metal layer 22, the semiconductor wafer is subjected to a rapid thermal anneal (RTA) where the wafer is heated in a multi-step process first to about 450° C. and then to about 700° C. to about 750° C. preferably in a nitrogen atmosphere. During the RTA process cobalt silicide is formed over the areas having underlying silicon or polysilicon areas, e.g., the gate 12, source 18, and drain 20 regions by diffusion of silicon to react with the overlying metal layer 22 to form a cobalt silicide ($CoSi_x$, e.g., $CoSi_2$). In the case titanium salicide is formed, the metal layer 22 is a titanium layer followed by a multi-step RTA process where a first RTA process is carried out at a temperature of about 620° C. to about 680° C. followed by a second RTA process at temperatures higher than about 750° C. to form a low resistance phase of titanium silicide (e.g., $TiSi_2$) over silicon containing portions of the substrate, i.e., the gate, source and drain regions, and titanium and titanium nitride over non-silicon containing portions of the substrate.

Referring to FIG. 1C, according to the present invention a wet etching process is carried out to selectively etch away the unsilicided portions of the cobalt or titanium metal layer 22. According to the present invention, an acidic mixture including phosphoric acid ($H_3PO_4$), nitric acid ($HNO_3$), and a carboxylic acid, preferably acetic acid ($CH_3COOH$), is used to selectively etch away the unsilicided portions of the metal layer 22 leaving self aligned silicides, e.g., 24A, 24B, and 24C over the gate, source, and drain regions, respectively. It will be appreciated that other suitable carboxylic acids include formic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, adipic acid, and combinations thereof. It is believed the carboxylic acid serves a complexing function that aids the selectivity of the etching process.

In one preferred embodiment, the acidic etching mixture includes about 65 to about 75 weight percent phosphoric acid, about 5 to about 15 weight percent nitric acid, about 1 to about 5 weight percent carboxylic acid, preferably acetic acid, with the remaining portion water, preferably deionized water. In a more preferred embodiment, the acidic etching mixture includes about 70 weight percent phosphoric acid, about 10 weight percent nitric acid, about 2 to about 3 weight percent carboxylic acid, preferably acetic acid, with the remaining portion water, preferably deionized water.

In another embodiment, the wet etching process includes at least a dipping process with optionally applied ultrasonic scrubbing, for example megasonic scrubbing for at least a portion of the dipping process. In a preferred embodiment, a sequential wet etching process is carried out where a first etching process including dipping and optional ultrasonic scrubbing is carried out in a first etching solution including a hydrogen peroxide ($H_2O_2$) solution of about 25 to about 35 weight percent $H_2O_2$ with the remaining portion water, preferably deionized water. The first etching process is carried out at a temperature of from about 20° C. to about 80° C., more preferably about 40° C. to about 60° C., most preferably about 50° C., for a period of about 1 to about 10 minutes, more preferably, about 3 to about 5 minutes. The first etching process is followed by a second etching process including the acidic etching mixture according to the preferred embodiments. The second etching process includes dipping and optional ultrasonic scrubbing carried out at temperatures of about 60° C. to about 90° C., more preferably about 75° C., for about 20 to about 30 minutes. Following the second etching process, a deionized water rinse and a conventional dry process completes the wet etching process for forming the cobalt salicide. It will be appreciated that the acidic etching mixture including the sequential etching process according to the present invention may be advantageously carried out on titanium metal and titanium nitride to form titanium salicides or local interconnects, for example overlying the cobalt salicide.

Figure 2A:
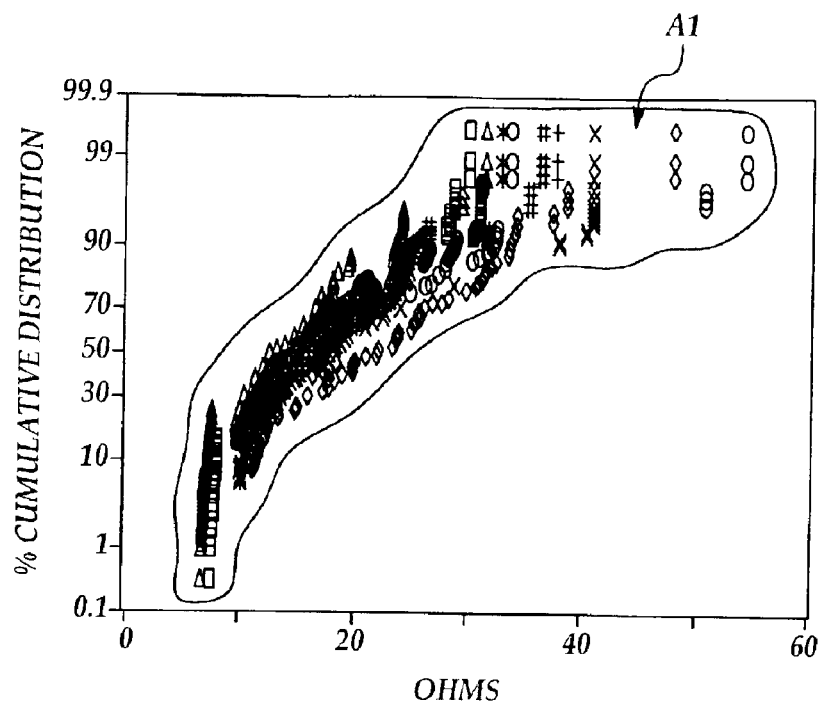
FIG. 2A is a cumulative distribution graph of sheet resistance measurements over a process wafer surface taken following prior art wet etching processes for forming salicides.
Figure 2B:
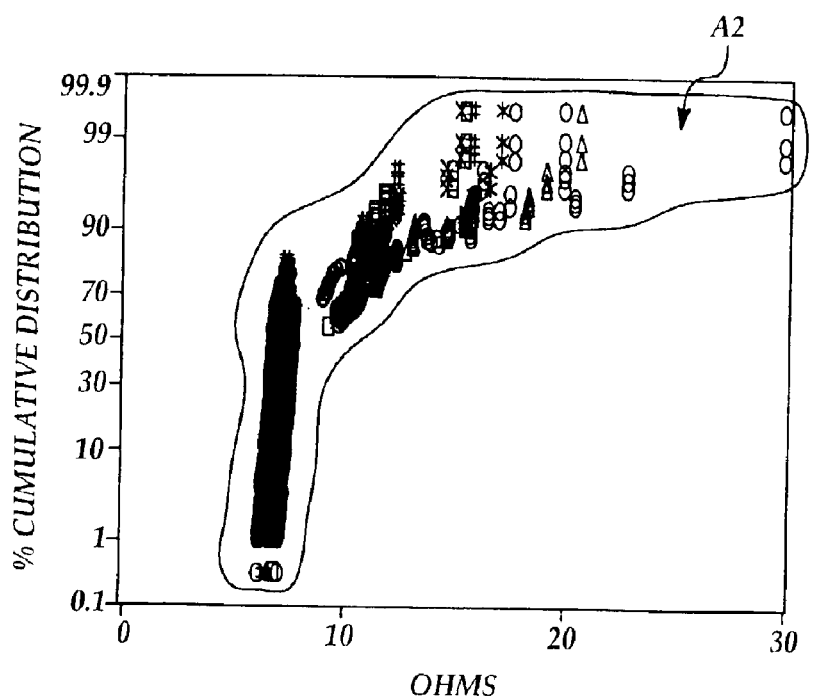
FIG. 2B is a cumulative distribution graph of sheet resistance measurements over a process wafer surface taken following the wet etching process for forming salicides according to an embodiment of the present invention.

In using the acidic etching mixture including the sequential etching process according to the present invention, it has been found that sheet resistance (Rs) values of the salicides, for example the cobalt silicide, is greatly improved. For example, salicides formed over N doped silicon and polysilicon showed reduced sheet resistances of about 30 percent compared to the prior art. By comparison, salicides formed over P doped silicon and polysilicon showed reduced sheet resistances of about 10 percent compared to the prior art. In addition, the distribution of sheet resistance values over measured areas of the wafer showed a substantially reduced distribution tail as indicated in a Weibull or cumulative distribution analysis, as is common in the art to represent a large number of measurements over various areas of a process wafer. For example, referring to FIGS. 2A and 2B, are shown exemplary cumulative distribution graphs of a series of sheet resistance measurements taken over an exemplary wafer according to methods commonly used in the art, for example according to a Van der Pauw four probe method. The vertical axis represents the cumulative percent of sheet resistance measurements below a sheet resistance value represented on the horizontal axis in ohms. In FIG. 2A are represented sheet resistance distributions of a cobalt silicide formed over N doped polysilicon using a wet etching method according to the prior art, for example SC-1 and SC-2 wet etching solutions. The area of resistance values is contained within area A1. It is seen that a significant distribution tail occurs for resistances greater than about 10 ohms, whereas sheet resistance values less than about 10 ohms occurs for only about 25 percent of the cumulative measurements. In contrast, in FIG. 2B is represented a cobalt silicide produced over N doped polysilicon using the wet etching solution and etching process according to a preferred embodiment of the invention, showing a significantly reduce sheet resistance distribution tail of resistance values included in area A2 where about 85 percent of the cumulative measurements are less than about 10 ohms. As a result, the wet etching method according to preferred embodiments provides more reliable and uniform etching giving lower sheet resistances over a larger portion of the process wafer.

Thus, a method has been presented for reliably and selectively wet etching unsilicided portions of a cobalt or titanium metal layer in the formation of a salicide. The wet etching process of the present invention allows achievement of lower sheet resistances and convergent values of sheet resistance over a process wafer with a significantly reduced distribution of sheet resistances. In addition, gate oxide integrity is preserved by providing a more selective wet etching process while reducing junction leakage. The method is especially useful in forming low resistance cobalt salicides over sub-quarter micron semiconductor devices with reliable electrical behavior.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming salicides with lower sheet resistance and increased sheet resistance uniformity over a semiconductor process wafer comprising the steps of:

providing a semiconductor process wafer having exposed silicon containing areas at a process surface;

depositing a metal layer comprising at least one refractory metal over the process surface;

carrying out at least one thermal annealing process to react the metal layer and silicon to form a metal silicide over the silicon containing areas;

wet etching in a first etching process the metal layer with a first wet etching solution consisting essentially of hydrogen peroxide and water; and, wet etching in a second etching process unsilicided areas of the metal layer with a second wet etching solution comprising a carboxylic acid.

2. The method of claim 1, wherein the silicon containing areas are selected from the group consisting of a gate, a source, and a drain region.

3. The method of claim 1, wherein the metal layer comprises cobalt and where the silicon containing areas comprise a linewidth of less than about 0.5 microns.

4. The method of claim 1, wherein the thermal anneal process comprises sequential rapid thermal annealing processes to lower the electrical resistance of the metal silicide.

5. The method of claim 1, wherein the first wet etching solution comprises from about 25 weight percent to about 35 weight percent hydrogen peroxide in deionized water.

6. The method of claim 1, wherein the carboxylic acid consists essentially of acetic acid.

7. The method of claim 1, wherein the carboxylic acid is selected from the group consisting of acetic acid, formic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

8. The method of claim 1, wherein the first wet etching process comprises a process selected from the group consisting of dipping and ultrasonic scrubbing at a temperature of from about 20° C. to about 80° C., for a period of about 1 to about 10 minutes.

9. The method of claim 1, wherein the second wet etching solution comprises about 65 to about 75 weight percent phosphoric acid, about 5 to about 15 weight percent nitric acid, and about 1 to about 5 weight percent carboxylic acid with a remaining portion deionized water.

10. The method of claim 9, wherein the second etching process comprises a process selected from the group consisting of dipping and ultrasonic scrubbing carried out at temperatures of about 60° C. to about 90° C. for about 20 to about 30 minutes.

11. A method for forming salicides in semiconductor devices with improved sheet resistance and improved sheet resistance uniformity over a semiconductor process wafer comprising the steps of:
  providing a semiconductor process wafer including exposed silicon containing areas at a process surface;
  depositing at least one metal layer selected from the group consisting of cobalt and titanium over the process surface;
  carrying out at least one thermal annealing process to react the at least one metal layer and silicon to form a metal silicide over the silicon containing areas;
  exposing the semiconductor process wafer to a solution consisting essentially of hydrogen peroxide and deionized water according to a process selected from the group consisting of dipping and scrubbing; and,
  wet etching the semiconductor process with a wet etching solution comprising phosphoric acid ($H_3PO_4$), nitric acid ($HNO_3$), and a carboxylic acid to leave salicides covering silicon containing areas at the process surface.

12. The method of claim 11, wherein the silicon containing areas are selected from the group consisting of a gate, source, and drain region.

13. The method of claim 11, wherein the hydrogen peroxide solution comprises from about 25 weight percent to about 35 weight percent hydrogen peroxide in deionized water.

14. The method of claim 11, wherein the wet etching solution comprises about 65 to about 75 weight percent phosphoric acid, about 5 to about 15 weight percent nitric acid, about 1 to about 5 weight percent carboxylic acid, with a remaining portion deionized water.

15. The method of claim 11, wherein the carboxylic acid is selected from the group consisting of acetic acid, formic acid, propionic acid, valeric acid, oxalic acid, maloric acid, succinic acid, glutaric acid, maleic acid, fumaric acid, phthalic acid, glycolic acid, lactic acid, citric acid, tartaric acid, gluconic acid, and adipic acid.

16. The method of claim 11, wherein the wet etching solution comprises about 70 weight percent phosphoric acid, about 10 weight percent nitric acid, and about 2 to about 3 weight percent acetic acid, with a remaining portion deionized water.

17. The method of claim 11, wherein the step of exposing is carried out at a temperature of from about 40° C. to about 60° C., for a period of about 3 to about 5 minutes.

18. The method of claim 11, wherein the step of wet etching is selected from the group consisting of dipping and ultrasonic scrubbing carried out at temperatures of about 60° C. to about 90° C. for about 20 to about 30 minutes.

19. A method for forming salicides in semiconductor devices with improved sheet resistance and improved sheet resistance uniformity over a semiconductor process wafer comprising the steps of:
  providing a semiconductor process wafer comprising exposed silicon containing areas at a process surface;
  depositing at least one refractory metal layer over the process surface;
  carrying out at least one thermal annealing process to react the at least one metal layer and silicon to form a metal silicide over the silicon containing areas;
  treating the semiconductor process wafer with a solution comprising hydrogen peroxide and deionized water according to a process selected from the group consisting of dipping and scrubbing; and,
  wet etching the semiconductor process with a wet etching solution comprising phosphoric acid ($H_{3PO4}$), nitric acid ($HNO_3$), and a carboxylic acid according to a process selected from the group consisting of dipping and scrubbing to leave salicides covering silicon containing areas at the process surface.

20. A method for forming salicides in semiconductor devices with improved sheet resistance and improved sheet resistance uniformity over a semiconductor process wafer comprising the steps of:
  providing a semiconductor process wafer comprising exposed silicon containing areas at a process surface;
  depositing at least one refractory metal layer over the process surface;
  carrying out at least one thermal annealing process to react the at least one metal layer and silicon to form a metal silicide over the silicon containing areas;
  treating the semiconductor process wafer with a solution consisting essentially of hydrogen peroxide and deionized water according to a process selected from the group consisting of dipping and scrubbing; and,
  wet etching the semiconductor process with a wet etching solution comprising phosphoric acid ($H_3PO_4$), nitric acid ($HNO_3$), and a carboxylic acid according to a process selected from the group consisting of dipping and scrubbing to leave salicides covering silicon containing areas at the process surface.

* * * * *